(12) United States Patent
Matsushita

(10) Patent No.: US 10,073,127 B2
(45) Date of Patent: Sep. 11, 2018

(54) SURFACE POTENTIAL SENSOR AND COPYING MACHINE

(75) Inventor: Soichi Matsushita, Yokohama (JP)

(73) Assignee: OMRON Corporation, Kyoto-shi (JP)

( * ) Notice: Subject to any disclaimer, the term of this patent is extended or adjusted under 35 U.S.C. 154(b) by 308 days.

(21) Appl. No.: 14/354,451

(22) PCT Filed: Mar. 14, 2012

(86) PCT No.: PCT/JP2012/056591
§ 371 (c)(1),
(2), (4) Date: Aug. 5, 2014

(87) PCT Pub. No.: WO2013/073207
PCT Pub. Date: May 23, 2013

(65) Prior Publication Data
US 2015/0028881 A1    Jan. 29, 2015

(30) Foreign Application Priority Data

Nov. 15, 2011    (JP) .................................. 2011-250186

(51) Int. Cl.
*G01R 29/12*    (2006.01)
*G01R 5/28*    (2006.01)
(Continued)

(52) U.S. Cl.
CPC .............. *G01R 29/12* (2013.01); *G01R 5/28* (2013.01); *G01R 29/08* (2013.01);
(Continued)

(58) Field of Classification Search
CPC .......... G01R 29/12; G01R 5/28; G01R 29/08; G01R 29/0814; G01R 29/0842;
(Continued)

(56) References Cited

U.S. PATENT DOCUMENTS

| 5,786,549 A | * | 7/1998 | Serizawa | ................. G01G 3/12 |
| | | | | 177/211 |
| 5,867,808 A | * | 2/1999 | Selker | ..................... G01L 5/162 |
| | | | | 338/2 |

(Continued)

FOREIGN PATENT DOCUMENTS

| CN | 101977763 A | 2/2011 |
| JP | 05-249165 A | 9/1993 |

(Continued)

OTHER PUBLICATIONS

JP 2009-68936 Machine Translation; dated Sep. 12, 2007.*

(Continued)

*Primary Examiner* — Huy Q Phan
*Assistant Examiner* — Raul Rios Russo
(74) *Attorney, Agent, or Firm* — Nutter McClennen & Fish LLP; John J. Penny, Jr.

(57) ABSTRACT

This surface potential sensor is provided with an electret electrode (28), which is configured of a metal film (26) and an electret film (27), said electret electrode being provided on an upper surface of a diaphragm (25) of a semiconductor substrate. Four piezoresistors (29*a*, 29*b*, 29*c*, 29*d*) are formed on the diaphragm (25), and a distortion quantity detecting unit (32) is configured by forming a bridge circuit using the piezoresistors. Since an electrostatic force that operates between an object and the electret electrode (28) changes corresponding to potential of the object, and the electret electrode (28) warps corresponding to the change, the potential of the object can be detected by measuring a distortion quantity of the electret electrode (28) by means of the distortion quantity detecting unit (32). Consequently, not only the potential of the object but also a polarity thereof can be detected with reduced size and high sensitivity.

6 Claims, 9 Drawing Sheets

(51) Int. Cl.
  *G01R 29/08* (2006.01)
  *G01R 31/26* (2014.01)
  *G03G 15/00* (2006.01)
  *G01R 15/14* (2006.01)
  *G01R 15/16* (2006.01)
  *G01R 19/00* (2006.01)

(52) U.S. Cl.
  CPC ..... *G01R 29/0814* (2013.01); *G01R 29/0842* (2013.01); *G01R 31/2642* (2013.01); *G03G 15/5037* (2013.01); *G01R 15/14* (2013.01); *G01R 15/165* (2013.01); *G01R 19/0023* (2013.01)

(58) Field of Classification Search
  CPC .. G01R 31/2642; G01R 15/14; G01R 15/165; G01R 19/0023; G01R 29/22; G01R 29/24; G01R 31/12; G01R 5/32; G01R 9/08
  USPC ................... 324/72, 109, 457, 458
  See application file for complete search history.

(56) References Cited

U.S. PATENT DOCUMENTS

| | | | |
|---|---|---|---|
| 2002/0080684 A1* | 6/2002 | Donskoy | B06B 1/0292 367/140 |
| 2002/0124656 A1* | 9/2002 | McIntosh | G01D 5/2417 73/753 |
| 2004/0055396 A1* | 3/2004 | Morimoto | G01L 1/146 73/862.045 |
| 2004/0104727 A1* | 6/2004 | Morimoto | G01D 5/2417 324/409 |
| 2004/0104735 A1* | 6/2004 | Morimoto | G06F 3/0338 324/660 |
| 2006/0069320 A1* | 3/2006 | Wolff | A61B 5/6831 600/509 |
| 2008/0048521 A1* | 2/2008 | Mabuchi | B60C 23/041 310/309 |
| 2008/0181437 A1* | 7/2008 | Suzuki | H04R 19/016 381/191 |
| 2009/0060234 A1* | 3/2009 | Liou | H04R 19/01 381/191 |
| 2010/0160737 A1* | 6/2010 | Shachar | A61B 5/0478 600/202 |
| 2010/0177914 A1* | 7/2010 | Heite | H04R 19/013 381/191 |
| 2011/0012438 A1 | 1/2011 | Kashiwagi et al. | |
| 2011/0108838 A1* | 5/2011 | Kageyama | B06B 1/0292 257/49 |
| 2011/0146056 A1* | 6/2011 | Liou | H04R 31/00 29/592.1 |
| 2011/0255720 A1* | 10/2011 | Kao | H04R 19/013 381/191 |

FOREIGN PATENT DOCUMENTS

| | | |
|---|---|---|
| JP | 09-257833 A | 10/1997 |
| JP | 2003-029504 A | 1/2003 |
| JP | 2004-184556 A | 7/2004 |
| JP | 2008-278607 A | 11/2008 |

OTHER PUBLICATIONS

International Search Report for Application No. PCT/JP2012/056591 dated Jun. 19, 2012 (4 Pages).

Chinese Office Action for Application No. 201280051964.8, dated Jul. 1, 2015 (6 pages).

Japanese Office Action for Application No. 2011-250186, dated Jun. 23, 2015 (11 pages).

Wakishima, Osamu, Measurement of electrostatic force using electret. Proceedings of the Physical Society of Japan, The Physical Society of Japan, Feb. 28, 2007, vol. 62, Issue 1-2, p. 393, 21aXJ-7.

* cited by examiner

SURFACE POTENTIAL SENSOR AND COPYING MACHINE

TECHNICAL FIELD

The present invention relates to a surface potential sensor and a copying machine. The present invention specifically relates to a surface potential sensor for measuring a surface potential of a target object by use of electrostatic force that operates between itself and the target object, and a copying machine provided with the surface potential sensor.

BACKGROUND ART

In a variety of equipment such as a copying machine, a printer and a liquid crystal display device, a surface potential of a specific portion in the equipment is measured. For example, as a photosensitive drum is used repeatedly in an electrostatic copying machine, a charged voltage of the photosensitive drum gradually decreases. When the charged voltage of the photosensitive drum falls below a certain level, a latent image quality deteriorates and thus less toner is applied or color unevenness occurs, leading to deterioration in printing quality. Therefore, a charged voltage of the photosensitive drum after charged by a charger has hitherto been measured by a surface potential sensor to monitor a deterioration state and a product cycle of the photosensitive drum. Then, when the charged voltage of the photosensitive drum falls below a predetermined value, for example, a warning that the photosensitive drum should be exchanged is given.

(Chopper-Type Potential Sensor)

There are several kinds of surface potential sensors, and one of them is a chopper-type surface potential sensor. FIG. 1 is a schematic diagram for explaining a measurement principle of chopper-type surface potential sensor 11. Surface potential sensor 11 has detection electrode 13 inside casing 12, and detection electrode 13 is connected to a ground via resistor Rs. In casing 12, window 14 is open as opposed to detection electrode 13. Further, chopper 15 is provided between detection electrode 13 and window 14. Chopper 15 is held at a ground potential, and has a pair of shields 16 that shield an electrostatic field passing through window 14 and moving toward detection electrode 13. Shields 16 vibrate in a fixed cycle, and a space between shields 16 is cyclically opened and closed. When surface potential sensor 11 is installed with window 14 facing charged object 17, an electrostatic field that comes out of charged object 17 is incident on the inside of surface potential sensor 11 from window 14, and further passes through between shields 16 to reach detection electrode 13. However, since shields 16 are cyclically opened and closed, an incidence area (number of electric force lines) of the electrostatic field that reaches detection electrode 13 changes.

This surface potential sensor 11 uses an electrostatic induction phenomenon. When detection electrode 13 is applied with an electrostatic field with strength Eo (proportional to charging potential Vo of charged object 17) from charged object 17, induction charge q is generated in detection electrode 13. However, since this cannot be detected as an electrical signal in such a static state, chopper 15 is provided between charged object 17 and detection electrode 13, and by opening and closing chopper 15, the incidence area of the electrostatic field is cyclically changed. When the incidence area of the electrostatic field is cyclically changed by chopper 15, induction charge q is cyclically changed in the same manner, and displacement current Is flows from detection electrode 13 to the ground. This displacement current Is is converted to alternating current voltage signal Vs by resistor Rs. Then, by measuring alternating current signal Vs, charging potential Vo of charged object 17 can be sensed. As such a chopper-type surface potential sensor, for example, one disclosed in Patent Document 1 is known.

However, in such a chopper-type surface potential sensor, a chopper for cyclically changing an incidence area of an electrostatic field is essential. Since a mechanical actuator is required in order to open and close the chopper, it is difficult to miniaturize the surface potential sensor. For example, in the surface potential sensor disclosed in Patent Document 1, a tuning fork-type component is required as shown in FIG. 15 of Patent Document 1. This tuning fork-type component is one formed by providing a pair of shields in its leading end portion and fitting a piezoelectric vibrator to its base portion, and is designed to amplify (resonate) vibration of the piezoelectric vibrator by means of the tuning fork-type component to open and close a chopper. This is quite a large component as compared with the chopper.

In such a chopper-type surface potential sensor, a mechanical actuator (tuning fork-type component) for opening and closing the chopper is required. This disables production of a MEMS (Micro Electro Mechanical Systems) device, making miniaturization of the surface potential sensor difficult and its manufacturing cost high, and also requires an operation to incorporate the component into the surface potential sensor.

With the chopper-type surface potential sensor having a large size and quite a large length as thus described, also in applications of measuring a charging potential of a photosensitive drum in a copying machine, it is impossible to ensure a space inside the copying machine which is large enough for moving the surface potential sensor along a width direction of the photosensitive drum. Further, moving the surface potential sensor is not possible since the actuator for driving the chopper would be affected. For that reason, this surface potential sensor can only monitor a portion of an outer periphery of the photosensitive drum, and thus has low reliability in terms of sensing deterioration in the photosensitive drum. On the other hand, in a copying machine for business purpose and the like, inspecting the entire photosensitive drum has been desired due to a requirement for printing quality comparable to that of a letterpress printing machine.

(Electrostatic Induction-Type Surface Potential Sensor)

There is another surface potential sensor using electrostatic force that operates between itself and a charged object. Such a sensor, for example, is disclosed in Patent Document 2. In this surface potential sensor, a movable electrode plate is located inside a frame-shaped support, and the movable electrode plate is supported by a pair of beam portions in a cantilever condition. The beam portion is provided with a strain gauge for detecting a warping quantity of the beam portion.

When the movable electrode plate is made opposed to the charged object, the movable electrode plate is attracted to the charged object due to electrostatic absorption force that operates therebetween. A warping quantity of the beam portion at that time is sensed by the strain gauge, and a potential of the charged object is calculated based on the warping quantity of the beam portion measured by the strain gauge.

However, in the surface potential sensor disclosed in Patent Document 2, it is just that the movable electrode plate is absorbed by charges induced on the surface of the movable electrode plate due to electrostatic induction, and hence the electrostatic absorption force is small. For this reason, when the beam portion has high rigidity, displacement in movable electrode plate is small, and it is thus difficult to obtain high measurement sensitivity. Further, when the beam portion has low rigidity and displacement in movable electrode plate is large, inclination of the movable electrode plate becomes large at the time of displacement. This may cause a characteristic change of the surface potential sensor depending on its installed direction, and hence it is difficult to incorporate the surface potential sensor into equipment. Moreover, since the surface potential sensor is greatly affected by acceleration due to vibration, it is also difficult to perform accurate measurement. Furthermore, in such a surface potential sensor, the movable electrode plate is attracted to the charged object regardless of the polarity (positive or negative voltage) of the charged object, and hence it is not possible to find the polarity of the charged object.

PRIOR ART DOCUMENTS

Patent Documents

Patent Document 1: Japanese Unexamined Patent Publication No. 2003-29504
Patent Document 2: Japanese Unexamined Patent Publication No. H5-249165

SUMMARY OF THE INVENTION

Problems to be Solved by the Invention

The present invention was made in view of the technical problems as described above, and has an object to provide a surface potential sensor which is small in size and highly sensitive, and further capable of sensing not only the potential of a target object but also its polarity.

Means for Solving the Problem

A surface potential sensor according to the present invention includes: a thin-film electret electrode with flexibility; and an electrostatic force detector configured to detect a change in electrostatic force that operates on the electret electrode.

In the surface potential sensor of the present invention, electrostatic force that operates on the electret electrode can be measured by the electrostatic force detector. Hence it is possible to sense a potential of the target object from the electrostatic force that operates between the target object and the electret electrode.

The surface potential sensor according to the present invention is not required to have an actuator with a mechanical structure, a chopper mechanism or the like as in a chopper-type surface potential sensor. Hence it is possible to miniaturize the surface potential sensor and make its manufacturing cost low. Especially by mass-producing the surface potential sensor by use of the MEMS technique, it is possible to make its size very small, so as to seek for significant cost reduction. Further, in the surface potential sensor of the present invention, it is possible to enhance the measurement sensitivity by use of the electret electrode, and further to sense whether the potential of the target object is a positive potential or a negative potential. Moreover, the surface potential sensor is not required to have an actuator with a mechanical structure, a chopper mechanism or the like, but has a simple structure, and hence it is resistant to breakdown and has high reliability.

MODE FOR CARRYING OUT THE INVENTION

Hereinafter, preferred embodiments of the present invention will be described with reference to the attached drawings. However, the present invention is not restricted to the following embodiments, and a variety of design changes can be made in a range not deviating from the scope of the present invention.

First Embodiment

Figure 1:
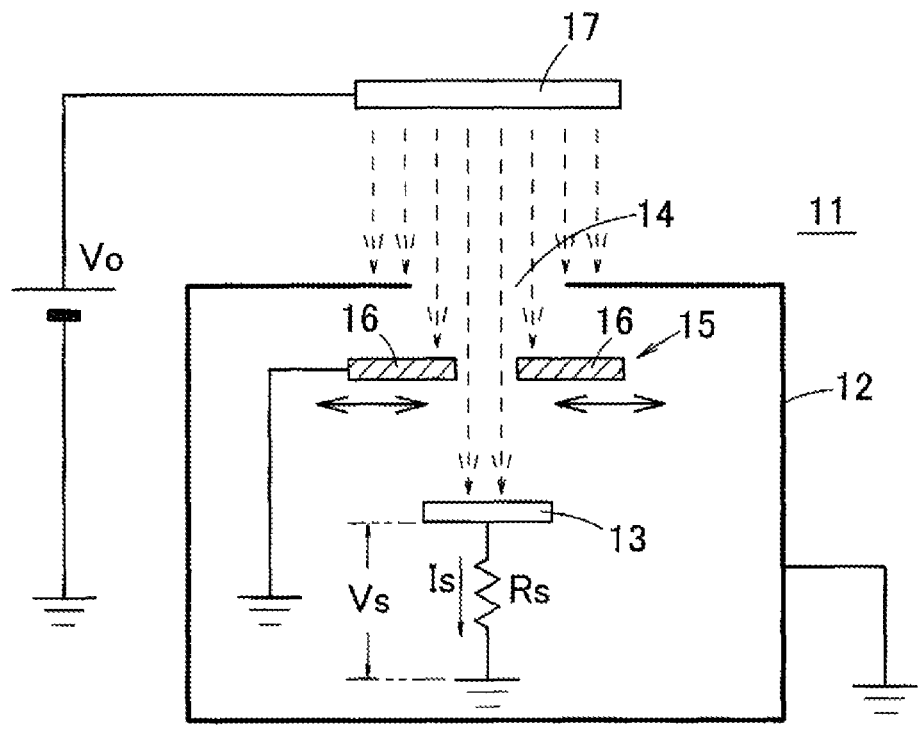
FIG. 1 is a schematic diagram for explaining a measurement principle of a conventional chopper-type surface potential sensor.
Figure 2:
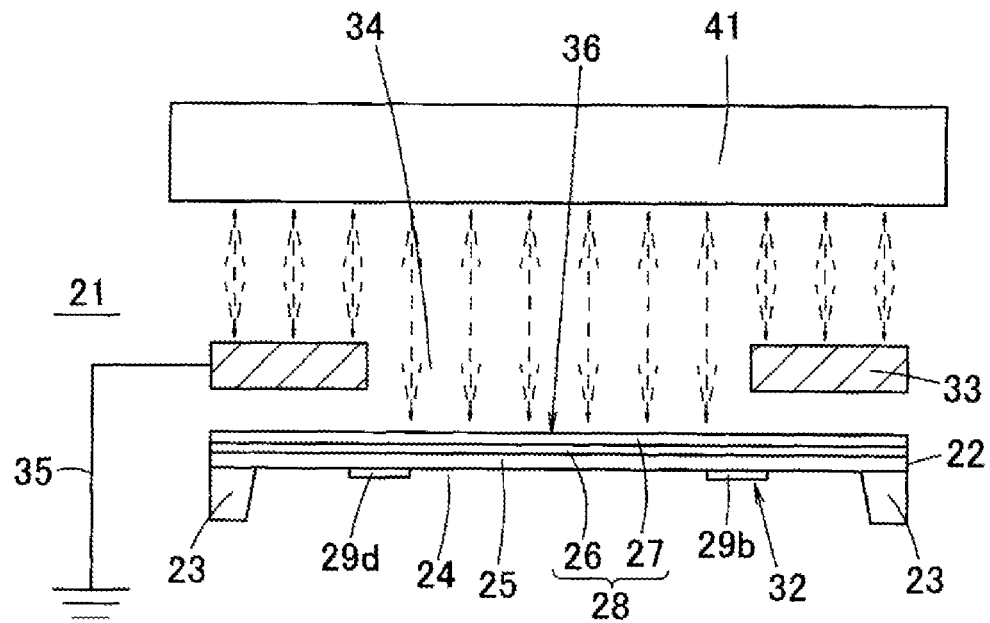
FIG. 2 is a schematic sectional view of a surface potential sensor according to a first embodiment of the present invention.
Figure 3:
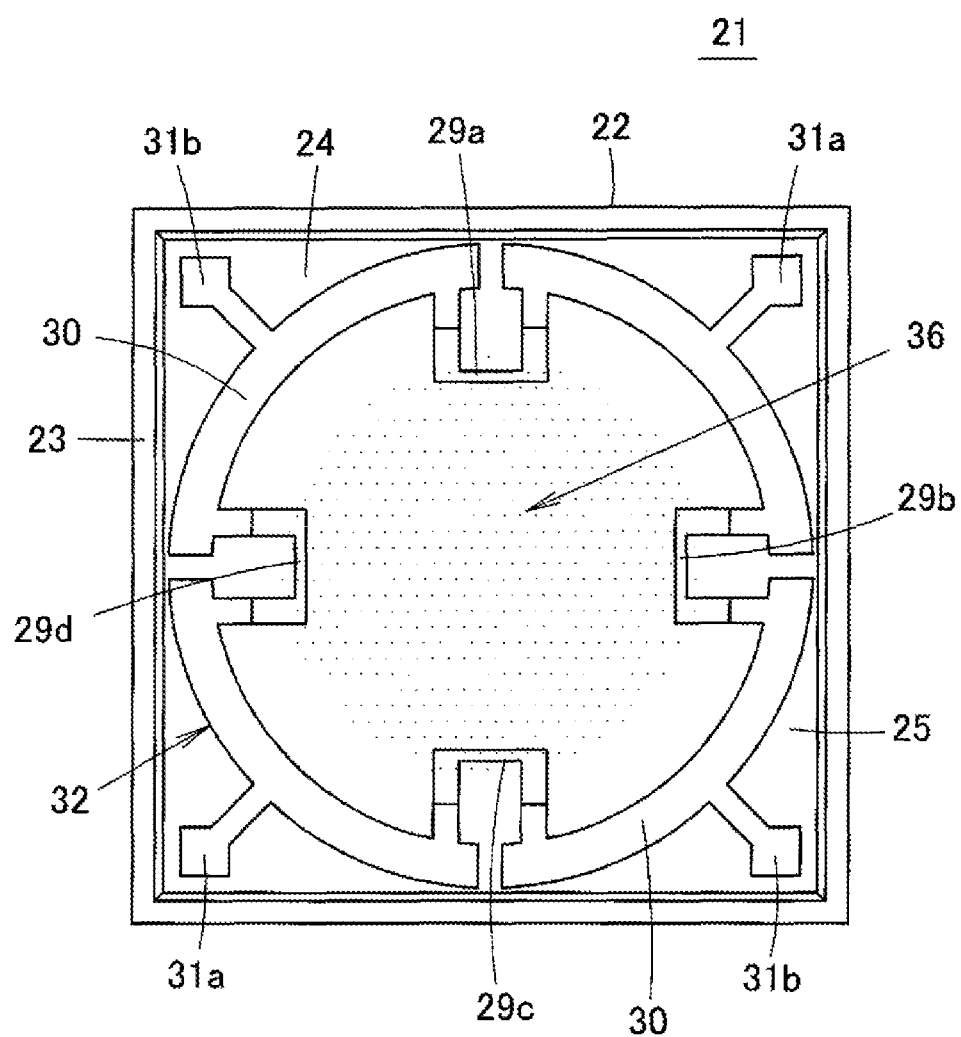
FIG. 3 is a bottom view of the surface potential sensor shown in FIG. 2.
Figure 4:
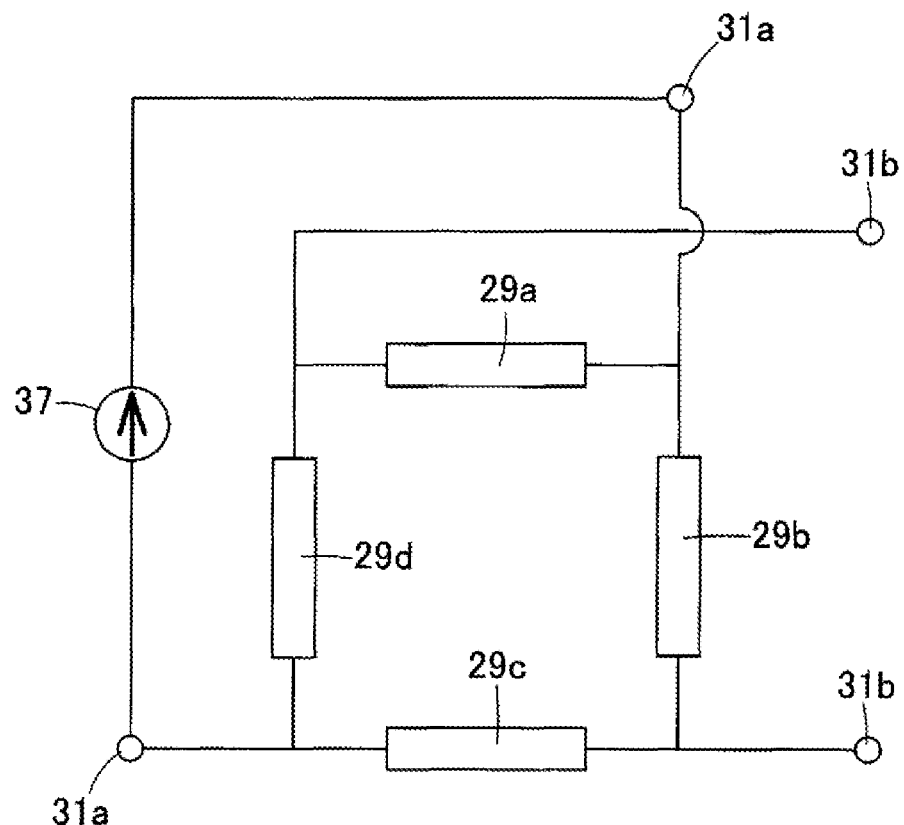
FIG. 4 is a circuit diagram showing a distortion quantity detecting unit in the surface potential sensor according to the first embodiment of the present invention.

Hereinafter, a surface potential sensor 21 according to the first embodiment of the present invention will be described with reference to FIGS. 2, 3 and 4. FIG. 2 is a schematic sectional view of a surface potential sensor 21 according to the first embodiment of the present invention, FIG. 3 is a bottom view of a surface potential sensor 21, and FIG. 4 is a circuit diagram showing a distortion quantity detecting unit 32 in the surface potential sensor 21.

As shown in FIG. 2, a support 23 with a relatively large thickness is provided on an outer peripheral portion of the lower surface of a semiconductor substrate 22 such as a silicon substrate, and a recessed portion 24 surrounded by the support 23 is formed on the lower surface of the semiconductor substrate 22. A thin-film diaphragm 25 (semiconductor layer) located on the recessed portion 24 is floating in a space through support by the support 23. A metal film 26 is formed on the upper surface of the semiconductor substrate 22, and an electret film 27 is formed on a metal film 26.

Electret is one formed as follows. A polymeric material (polytetrafluoroethylene, polypropylene, mylar, etc.) resistant to conducting electricity is heated and melts, which is then solidified between electrodes while being applied with a direct-current high voltage, and thereafter, the electrodes are removed. Each of the surfaces having been in contact with the electrodes is positively or negatively charged, and polarization (a state where the electricity is divided into positive one and negative one) of those is semi-permanently held. However, in this embodiment, corona discharging is generated by a wire electrode (not shown) with a metal film 26 taken as an electrode, thereby to positively or negatively charge the surface of an electret film 27. An electret electrode 28 is configured by the electret film 27 charged with the metal film 26.

An electrostatic shield member 33 is provided above the electret electrode 28 to cover the electret electrode 28, and the electrostatic shield member 33 is connected to the ground through ground wiring 35. Further, a window 34 having a predetermined size is opened in the electrostatic shield member 33. With the electrostatic shield member 33 connected to the ground, electrostatic force from a target object 41 (charged object) opposed to the surface potential sensor 21 is shielded by the electrostatic shield member 33. Accordingly, electrostatic force operates only through the window 34 of the electrostatic shield member 33 between the target object 41 and the electret electrode 28. A predetermined region of target object 41 can thus be sensed while an influence of a periphery of the window 34 is removed.

The electrostatic force that operates between the target object 41 and the electret electrode 28 increases with increase in charging potential (electrification charge density) of the target object 41. Further, a warping direction of the electret electrode 28 differs depending on the polarity of the electrification charge of the target object 41. For example, when the upper surface of the electret electrode 28 is positively charged, in the case of the surface of the target object 41 being negatively charged, the electrostatic induction force operates between the target object 41 and the electret electrode 28, and the electret electrode 28 is thus bent so as to swell to the target object 41 side. On the contrary, in the case of the surface of the target object 41 being positively charged, electric repulsive force operates between the target object 41 and the electret electrode 28 and the electret electrode 28 is thus bent so as to swell to the opposite side to the target object 41 side.

In FIG. 3, a region provided with small dots represents a region (hereinafter referred to as an induction region 36) opposed to the window 34 of the electrostatic shield member 33 and applied with electrostatic force from the target object 41. On a peripheral portion of the induction region 36, four piezoresistors 29a, 29b, 29c, 29d are provided at regular intervals on the rear surface of the diaphragm 25. Each of piezoresistors 29a to 29d is formed by performing impurity diffusion or ion implantation on the semiconductor substrate 22. Since a resistance value of each of piezoresistors 29a to 29d changes in accordance with a distortion quantity of diaphragm 25, a potential of the target object 41 can be calculated from a change in resistance value of each of piezoresistors 29a to 29d. Further, since a peripheral portion of the induction region 36 is a region where the largest distortion occurs, providing piezoresistors 29a to 29d in this region can enhance the measurement sensitivity.

A distortion quantity detecting unit 32 (electrostatic force detector) is configured of four piezoresistors 29a, 29b, 29c, 29d which are connected through wiring 30, to give a bridge circuit as in FIG. 4. Further, electrode pads 31a, 31b, 31a, 31b are provided on respective wiring 30 among respective piezoresistors 29a, 29b, 29c, 29d. A constant current power source 37 is connected to between electrode pads 31a, 31a of the distortion quantity detecting unit 32, and an output signal (differential output voltage) corresponding to a distortion quantity of the electret electrode 28 (charging potential of target object 41) is outputted from between electrode pads 31b, 31b.

It is to be noted that in the bridge circuit as in FIG. 4, when the resistance value (initial value) of each of piezoresistors 29a to 29d is the same, in a case where the electret electrode 28 is uniformly bent, it seems like an output voltage from electrode pad 31b becomes zero. However, the silicon substrate and the like have crystal anisotropy and distortion quantities respectively generated in a longitudinal direction and lateral direction are not uniform. Accordingly, even when the electret electrode 28 is uniformly warped, differential output voltages are outputted from electrode pads 31b, 31b, making it possible to measure the potential of target object 41. Further, it is also possible to determine from this differential output voltage as to whether the potential of the target object 41 is positive or negative Further in distortion quantity detecting unit 32 as in FIG. 4, part of piezoresistors (e.g., piezoresistors 29b, 29d) may be made constant resistors.

The potential of the target object 41 can be calculated by this surface potential sensor 21 due to a principle as follows. When a distortion quantity of the electret electrode 28 can be detected by using the distortion quantity detecting unit 32 made up of the piezoresistors, electrostatic force that operates on the electret electrode 28 can be obtained in consideration of an elastic modulus and the like of the electret electrode 28. Further, the potential of the target object 41 can be measured in consideration of the positional relation between the surface potential sensor 21 and the target object 41, and the like.

Subsequently, electrostatic force that operates on the surface potential sensor using the electret electrode will be considered. According to the formula for a parallel plate capacitor, electrostatic force P that operates on the electret electrode per unit area is calculated by following Mathematical Formula 1:

$$P=F/S=\varepsilon o \cdot V1 \cdot V2/(2d^2)$$ (Mathematical Formula 1)

where

εo: dielectric constant in vacuum d: distance between surfaces of electret electrode and target charged object V1: charged voltage of electret electrode V2: charged voltage of target charged object S: area of opposed surface of each of electret electrode and target charged object F: electrostatic force that operates on electret electrode Further, the distortion quantity δ of a diaphragm in the case of uniform electrostatic force operating on a disc-like diaphragm is calculated by following Mathematical Formula 2:

$$\delta=12r^4 \cdot P \cdot (1-v^2)/(64E \cdot t^3)$$ (Mathematical Formula 2)

where r: radius of movable region of diaphragm and electret electrode

P: electrostatic force that operates on electret electrode per unit area v: Poisson's ratio of diaphragm E: Young's modulus of diaphragm t: film thickness of diaphragm From above Mathematical Formula 1 and Mathematical Formula 2, the following formula holds:

$\delta = 3r^4 \cdot \varepsilon o \cdot V1 \cdot V2 \cdot (1-v^2)/(32d^2 \cdot E \cdot t^3)$ There has been realized a diaphragm-type pressure sensor using a general piezoresistor where a diaphragm has a diameter of 0.6 mm and a sensitivity of the order of 6 Pa, and as for a distortion quantity of the diaphragm, this is equivalent to the order of $4.3 \times 10^{-11}$ m.

For obtaining the same distortion quantity as the distortion quantity ($\delta = 4.3 \times 10^{-11}$ m) of the pressure sensor with such a sensitivity, on a condition that distance d between the electret electrode and the target charged object is 3 mm, a required diameter (2r) of the diaphragm is 4.4 mm in the case of charged voltage V2 of the target charged object being 5 V.

Provided:
$\varepsilon o = 9 \times 10^{-12}$ F/m
V1 = 800 V
V2 = 5V
d = 3 mm
v = 0.34 (average value of film thickness loads of silicon-made diaphragm, metal layer and electret film)
$E = 1.88 \times 10^5$ N/mm² (Young's modulus of silicon)
t = 10 μm (film thickness of silicon-made diaphragm)

It is to be noted that Young's moduli of the metal layer (film thickness: 0.3 μm) and the electret electrode (thickness: 15 μm) are typically sufficiently small as compared with that of the silicon-made diaphragm, and are not included in the calculation because they are considered to be in an ignorable range.

Surface potential sensor 21 according to the first embodiment of the present invention has an advantage as follows. With the electret electrode having high affinity with a semiconductor process, the use of the MEMS technique allows integrated manufacturing of a surface potential sensor 21 by a MEMS semiconductor process. Furthermore, with no mechanical mechanism used, it is possible to make the size of the surface potential sensor 21 very small. For example, it is possible to make the size of the order of 3 to 5 mm longitudinal and lateral lengths as seen from a direction of FIG. 3. Further, since the surface potential sensor 21 has no mechanical mechanism, its manufacturing cost can be made low, it is resistant to breakdown, its reliability is improved, and low power consumption can also be sought. Moreover, since the surface potential sensor 21 uses an electret electrode 28, large electrostatic force operates between itself and a target object 41 as compared with the case of using a mere metal electrode, and warping of the electret electrode 28 is increased, to significantly improve the measurement sensitivity. Furthermore, it becomes possible to determine whether the charging potential of the target object 41 is positive or negative. Additionally, since the surface potential sensor 21 has a structure without a directivity, its incorporation into equipment is also easy.

Second Embodiment

Figure 5:
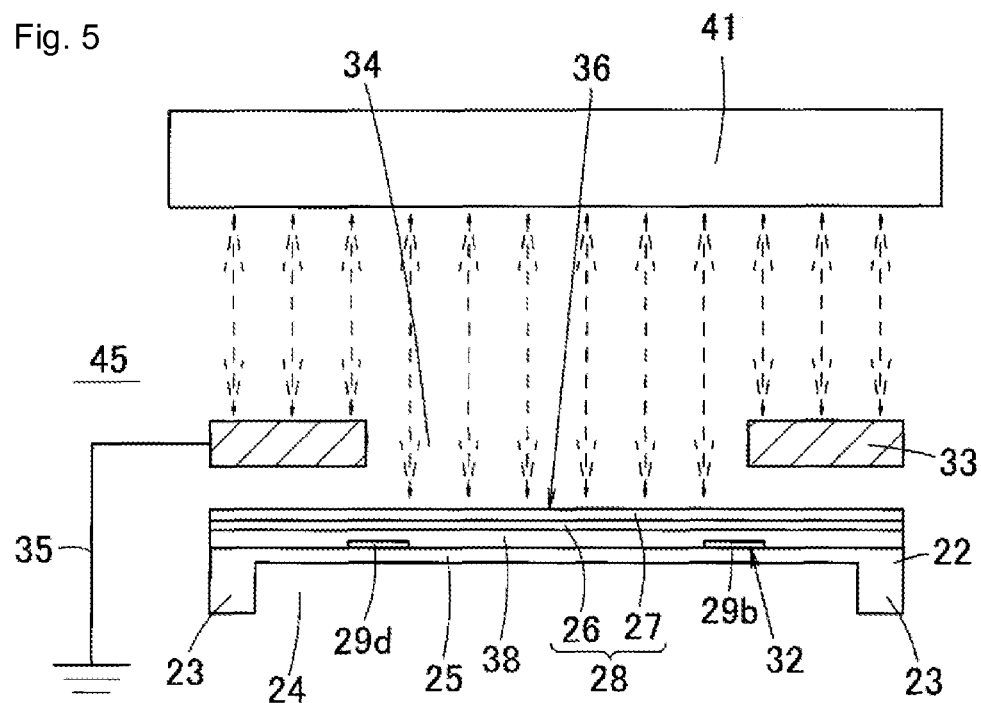
FIG. 5 is a schematic sectional view of a surface potential sensor according to a second embodiment of the present invention.

FIG. 5 is a schematic sectional view showing a surface potential sensor 45 according to a second embodiment of the present invention. In this surface potential sensor 45, a recessed portion 24 is formed by etching on the lower surface of a semiconductor substrate 22 such as a silicon substrate, and a support 23 is formed therearound. Further, a thin-film diaphragm 25 is formed of the semiconductor substrate 22 on the recessed portion 24, and piezoresistors 29a to 29d are provided on the upper surface of the diaphragm 25. Moreover, the upper surface of the semiconductor substrate 22 is covered by an insulating layer 38 such as an oxide film or a nitride film, on which an electret electrode 28 made up of a metal film 26 and an electret film 27 is formed.

In this surface potential sensor 45, piezoresistors 29a to 29d are produced on the upper surface of semiconductor substrate 22 (wafer), and further, the insulating layer 38, the metal film 26 and the electret film 27 are sequentially formed on the upper surface of the semiconductor substrate 22. Thereafter, the semiconductor substrate 22 is etched from its lower surface, to form the recessed portion 24 and the diaphragm 25 thereon. Manufacturing a surface potential sensor 45 in such a manner facilitates its handling during the manufacturing process, to simplify the manufacturing process.

Third Embodiment

Figure 6:
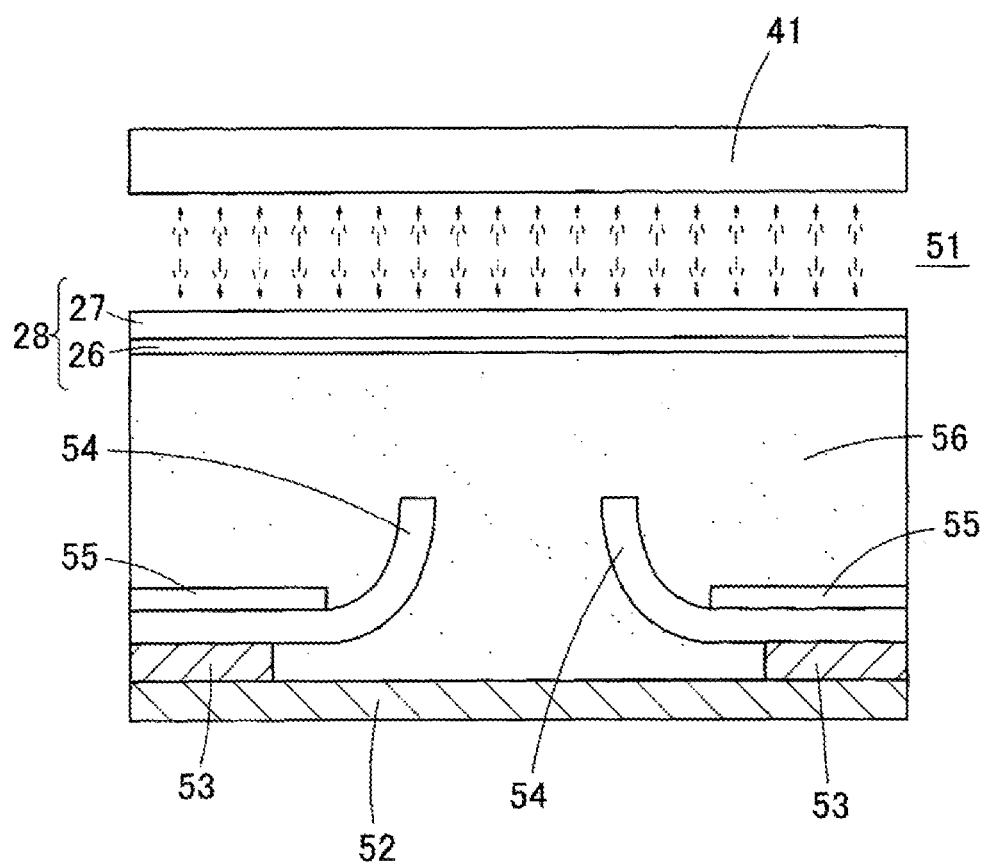
FIG. 6 is a schematic sectional view of a surface potential sensor according to a third embodiment of the present invention.

FIG. 6 is a schematic sectional view of surface potential sensor 51 according to a third embodiment of the present invention. In this surface potential sensor 51, a base 53 is provided on the upper surface of a tabular substrate 52, and a sensing lever 54 (deformable member) is provided on the base 53. The sensing lever 54 has a base portion fixed to the upper surface of the base 53, and a leading end portion curved upward and extended away from the base 53. Further, a strain gauge 55 (distortion quantity detecting device) is fitted to a portion where the largest distortion occurs when force is applied to the sensing lever 54. This sensing lever 54 and the strain gauge 55 constitute an electrostatic force detector. Further, on the upper surface of the substrate 52, an elastic material 56 such as silicon rubber is molded so as to embed the base 53, the sensing lever 54 and the strain gauge 55. The upper surface of the elastic material 56 is formed flat, and the electret electrode 28 made up of the metal film 26 and the electret film 27 is formed on the upper surface of the elastic material 56. The sensing lever 54 and the strain gauge 55 are provided in each of four directions of the upper surface of the substrate 52.

In this surface potential sensor 51, since the electrostatic shield member 33 is not provided, electrostatic force operates between the entire surface of the electret electrode 28 and the target object 41. Further, when the electrostatic force operates on the electret electrode 28, warping of the electret electrode 28 which occurs due to the electrostatic force operates on the leading end portion of the sensing lever 54 through the elastic material 56. Then, the potential of the target object 41 is sensed by detecting deformation of the sensing lever 54 by the strain gauge 55. Further, in this surface potential sensor 51, since the whole surface of the electret electrode 28 is supported by the elastic material 56, the electret electrode 28 is resistant to damage, and the durability of the surface potential sensor 51 is improved.

Fourth Embodiment

Figure 7:
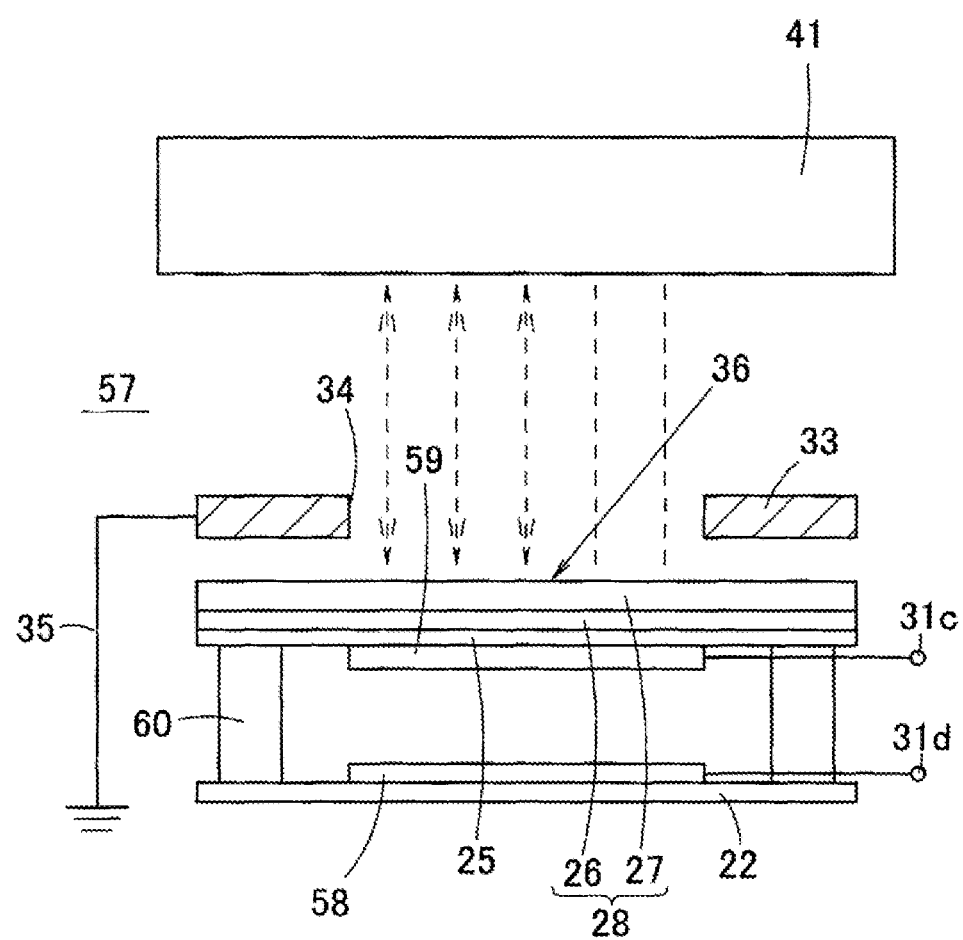
FIG. 7 is a schematic sectional view of a surface potential sensor according to a fourth embodiment of the present invention.

FIG. 7 is a schematic sectional view of a surface potential sensor 57 according to a fourth embodiment of the present invention. This surface potential sensor 57 is provided with a capacitance-type electrostatic force detector.

In this surface potential sensor 57, a fixed electrode 58 made of a metal film or polysilicon is formed on the upper surface of the semiconductor substrate 22 such as a silicon substrate. A thin-film diaphragm 25 made of a silicon thin film or an insulating film is arranged above the semiconductor substrate 22, and an outer peripheral portion of the lower surface of the diaphragm 25 is supported by a support 60 made of an insulating film such as an oxide film or a nitride film. Further, an thin-film electret electrode 28, made up of a metal film 26 and an electret film 27, is formed on the upper surface of the diaphragm 25. A movable electrode 59 made of a metal film or polysilicon is formed on the lower surface of the diaphragm 25 so as to be opposed to the fixed electrode 58 through an interval. Output terminals 31c, 31d are drawn from the movable electrode 59 and the fixed electrode 58, respectively. Further, an electrostatic shield member 33 is arranged above the electret electrode 28.

Accordingly, when electrostatic induction force operates between the electret electrode 28 and the target object 41 through the window 34 of the electrostatic shield member 33 and a central portion of the electret electrode 28 (central portion of an induction region 36) is displaced, a capacitance between the fixed electrode 58 and the movable electrode 59 changes, and a displacement amount of the electret electrode 28 can thus be seen from the change in capacitance. Hence it is possible to measure electrostatic force that operates on the electret electrode 28, and further to measure the potential of the target object 41. Furthermore, in this embodiment, since displacement of the central portion of electret electrode 28 can be sensed, it is possible to manufacture a surface potential sensor 57 with higher sensitivity.

Fifth Embodiment

Figure 8:
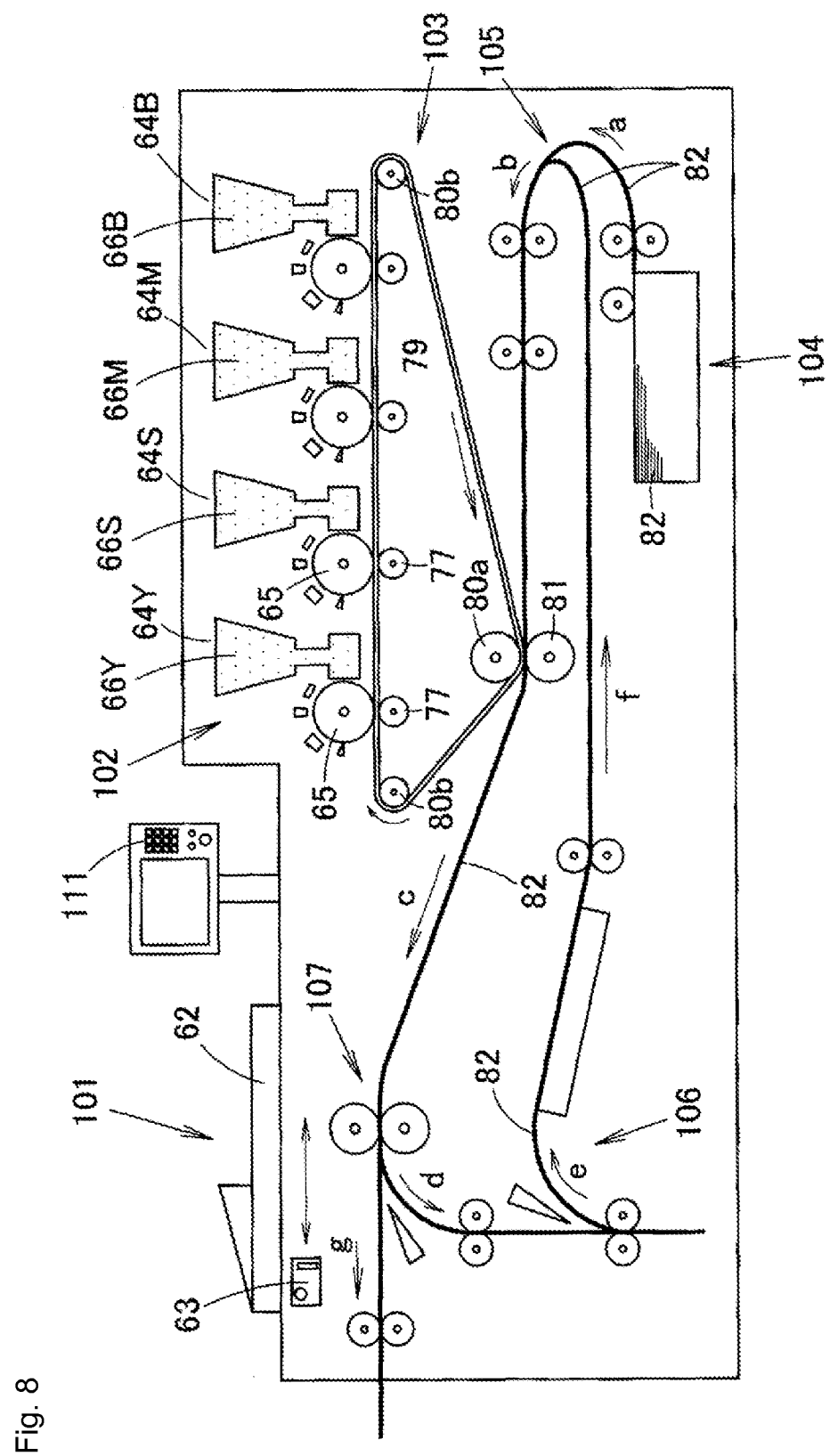
FIG. 8 is a schematic diagram of a copying machine according to the present invention.
Figure 9:
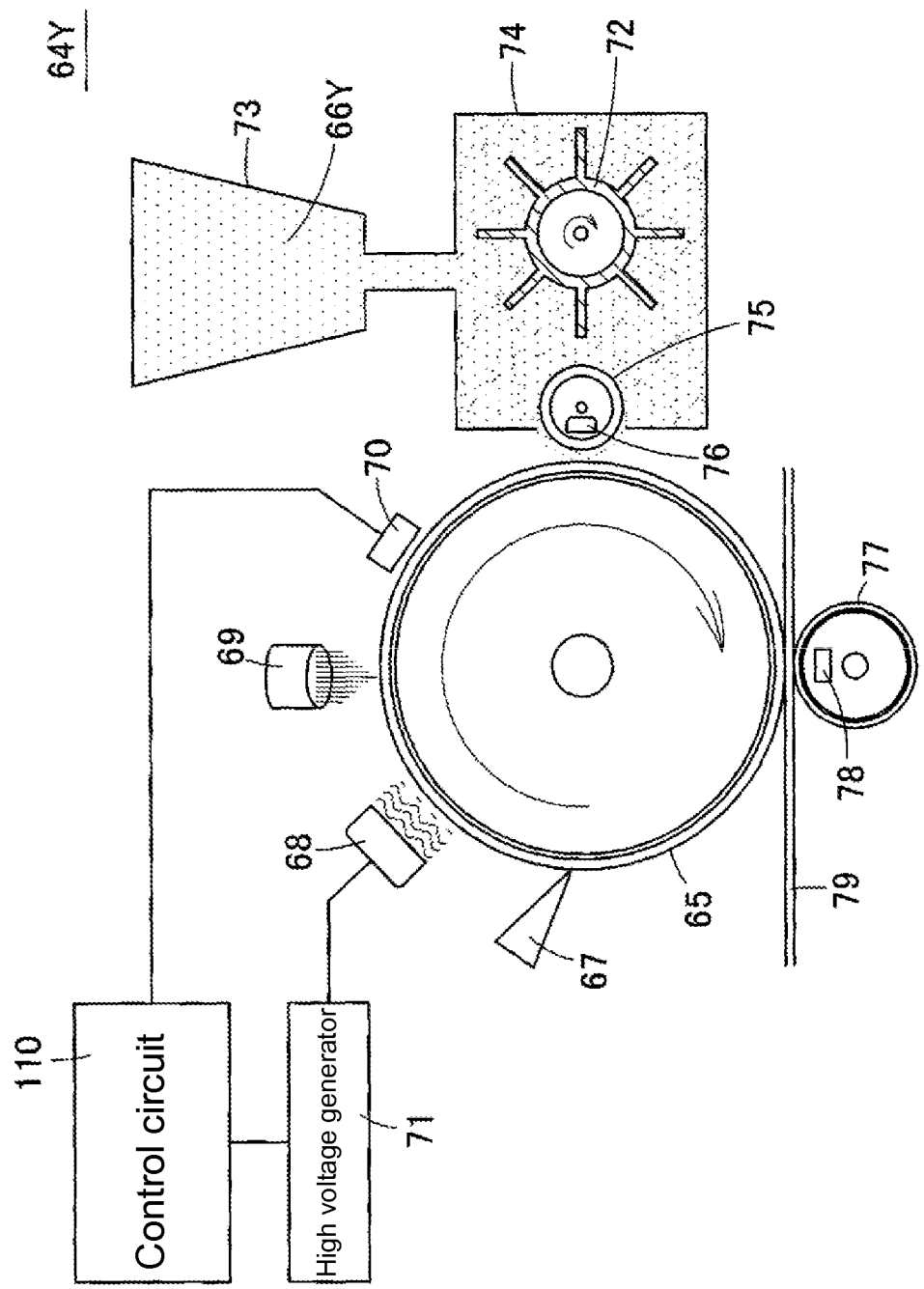
FIG. 9 is a schematic diagram representing a structure of a periphery of a photosensitive drum in the copying machine of FIG. 8.
Figure 10:
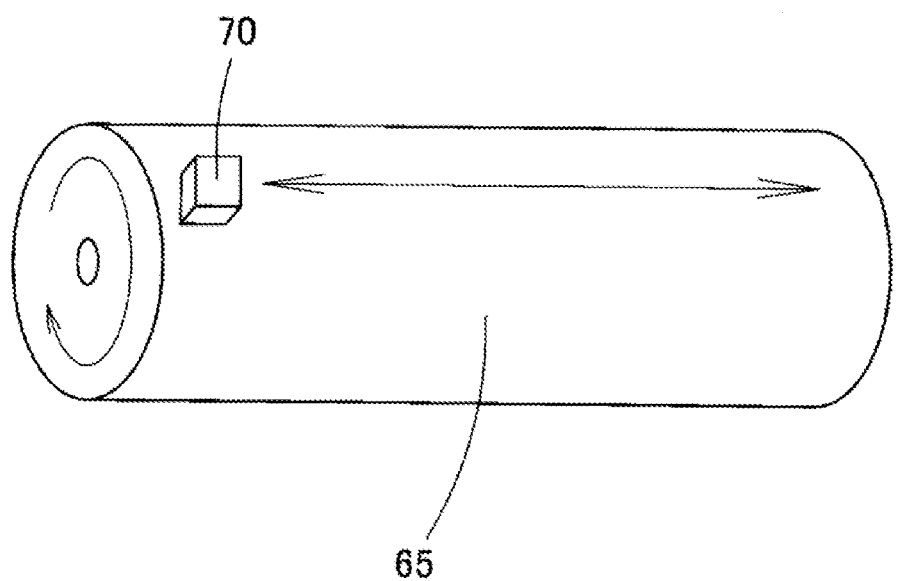
FIG. 10 is a perspective view showing a surface potential sensor that travels along the photosensitive drum.
Figure 11:
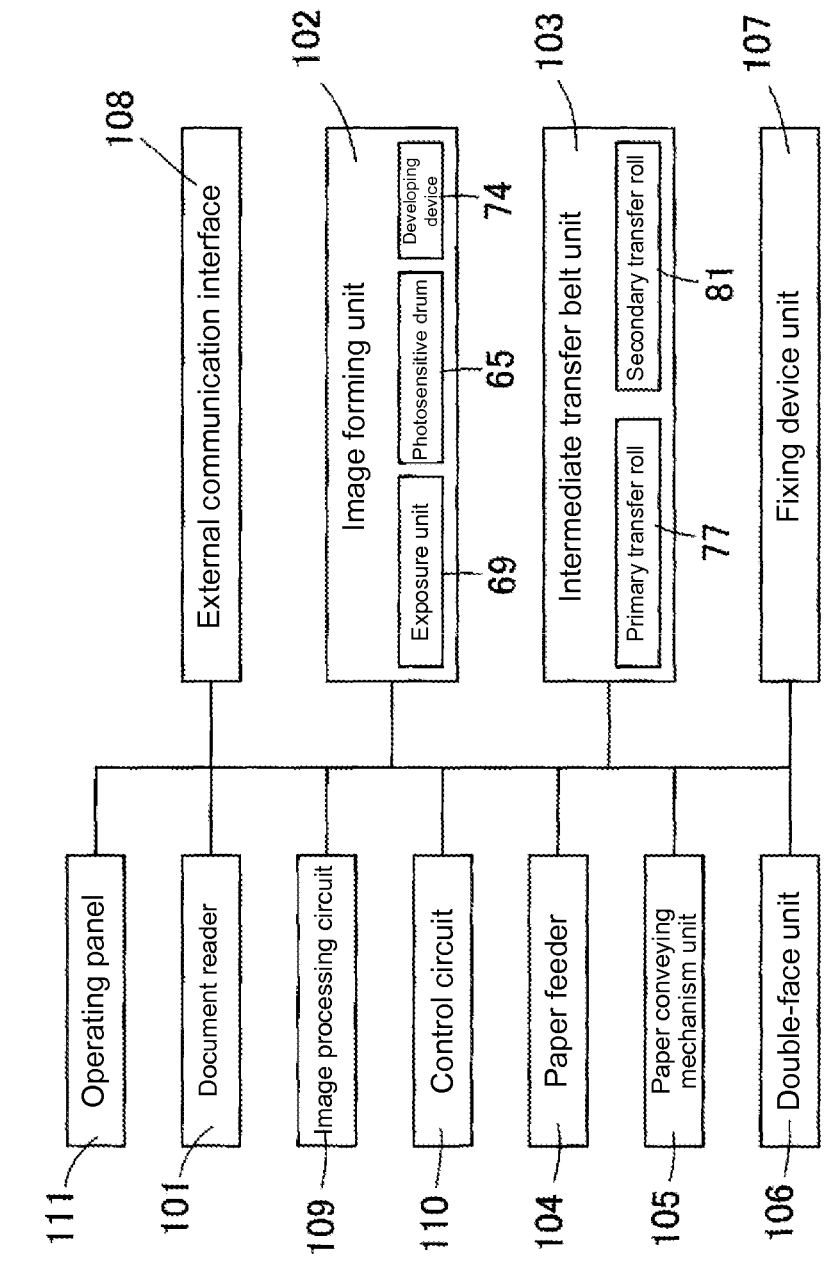
FIG. 11 is a control block diagram of the copying machine shown in FIG. 8.

FIG. 8 is a schematic diagram of a (electrostatic) copying machine 61 according to the present invention. FIG. 9 is a schematic diagram showing a structure of a periphery of one photosensitive drum in copying machine 61. FIG. 10 is a perspective view showing a surface potential sensor that travels along the photosensitive drum. FIG. 11 is a control block diagram of the copying machine 61.

As shown in FIGS. 8 and 11, the copying machine 61 is mainly made up of a document reader 101, an image forming unit 102, an intermediate transfer belt unit 103, a paper feeder 104, a paper conveying mechanism unit 105, a double-face unit 106, a fixing device unit 107, an external communication interface 108, an image processing circuit 109, a control circuit 110, and an operating panel 111. The document reader 101 is made up of an automatic document feeder 62 that feeds a plurality of documents one by one to a document platen, and a scanner 63 that reads a document set in the document platen. When the document reader 101 receives a copy start instruction from the operating panel 111, the automatic document feeder 62 feeds documents one by one, and the scanner 63 reads the documents. An image of a color document read by the scanner 63 is transmitted to an image processing circuit 109. The image processing circuit 109 decomposes the color image into a yellow image, a cyan image, a magenta image and a black image, and transmits each image data to the image forming unit 102.

It is to be noted that, although the above example is the case of using a copying machine 61 as a copying function by operation of the operating panel 111, there is also a case where the copying machine 61 receives printing data and a printing instruction from external equipment such as a personal computer (PC) via the external communication interface 108, and is used as a printing function.

The image forming unit 102 is made up of: a yellow transfer unit 64Y that reproduces a yellow image by means of yellow toner 66Y; a cyan transfer unit 64S that reproduces a cyan image by means of cyan toner 66S; a magenta transfer unit 64M that reproduces a magenta image by means of magenta toner 66M; and a black transfer unit 64B that reproduces a black image by means of black toner 66B. Since respective color transfer units 64Y, 64S, 64M, 64B are different only in color to be used and have the same mechanical structure, FIG. 9 shows yellow transfer unit 64Y as a representative.

As shown in FIG. 9, a cleaning blade 67, a charger 68, an exposure unit 69, a surface potential sensor 70 and a developing device 74 are installed on an outer periphery of a photosensitive drum 65. The cleaning blade 67 performs cleaning by scraping off toner remaining on the surface of the photosensitive drum after transfer of the toner. The charger 68 is supplied with a high voltage by a high voltage generator 71, and the charger 68 applies positive or negative charges to the surface of the photosensitive drum 65 having no charge after cleaning, to charge the surface of the photosensitive drum 65. An exposure unit 69 performs scanning with laser light along the surface of the charged photosensitive drum 65, to generate an electrostatic latent image of a yellow image on the surface of the photosensitive drum 65. For example, in the case of a laser exposure system, scanning is performed by casting light to a portion where toner is to be put.

A surface potential sensor 70 is the surface potential sensor according to the present invention and is, for example, the surface potential sensor 21 of the first embodiment, the surface potential sensor 45 of the second embodiment, the surface potential sensor 51 of the third embodiment, the surface potential sensor 57 of the fourth embodiment, or the like. The surface potential sensor 70 is installed on a movement table or the like, and as shown in FIG. 10, it measures a potential of the surface of the photosensitive drum 65 while reciprocating along a width direction of the photosensitive drum 65. Measurement data of the surface potential of the photosensitive drum 65 is transmitted to the control circuit 110.

A developing device 74 is supplied with yellow toner 66Y inside a toner bottle 73, and yellow toner 66Y is mixed with carriers inside the developing device 74 and stirred by a stirring screw 72. Yellow toner 66Y inside the developing device 74 is charged by a separating charger 76, and is supplied, while being put on the surface of a magnetic roll 75, from the magnetic roll 75 to the surface of the photosensitive drum 65. On the other hand, the carriers are absorbed to the magnetic roll 75 and collected. In such a manner, yellow toner 66Y inside the developing device 74 is absorbed to and held in a charged region on the surface of the photosensitive drum 65, and a mirror image of the yellow image is produced on the surface of the photosensitive drum 65. Below the photosensitive drum 65, a primary transfer roll 77 is opposed thereto, and a toner transferring charger 78 is provided inside the primary transfer roll 77. Therefore, an intermediate transfer belt 79 passing through between the photosensitive drum 65 and the primary transfer roll 77 is charged by the toner transferring charger 78, and yellow toner 66Y on the photosensitive drum 65 is transferred to the intermediate transfer belt 79.

Operations of the cyan transfer unit 64S, the magenta transfer unit 64M and the black transfer unit 64B are the same as that of the yellow transfer unit 64Y. Therefore, by the intermediate transfer belt 79 passing through the respective color transfer units 64Y, 64S, 64M, 64B, a mirror image of a color image is formed on the surface of the intermediate transfer belt 79.

As the photosensitive drum 65 repeats charging and removing electricity in such a manner, it gradually deteriorates, and then, the surface of the photosensitive drum 65 becomes unable to be fixed with sufficient charges even when charges are supplied by the charger 68. This prevents formation of a clear latent image, causing gradual deterioration in printing quality. For this reason, in this copying machine 61, the charger 68 is feedback-controlled by means of an output signal of surface potential sensor 70, as shown in FIG. 9. That is, when the control circuit 110 determines that the surface potential of the photosensitive drum 65, measured by a surface potential sensor 70, has fallen below a predetermined level, the control circuit 110 sets an output voltage of high voltage generator 71 so as to become higher than previously, thus adjusting the surface potential of the photosensitive drum 65 so as to become not lower than the predetermined level. Further, when deterioration in the photosensitive drum 65 further proceeds and then exceeds the adjustment range of the charger 68, the control circuit 110 outputs a warning that the photosensitive drum 65 should be exchanged.

Moreover, since the surface potential sensor 70 can be made very small, it can be caused to travel along the surface of the photosensitive drum 65 in its width direction. It thus becomes possible to inspect not only a portion but the entire surface of the photosensitive drum 65, and to keep the photosensitive drum 65 in a good condition. Hence it is possible to prevent printing unevenness, and realize favorable printing quality.

The intermediate transfer belt 79 constitutes the intermediate transfer belt unit 103. That is, as shown in FIG. 8, the intermediate transfer belt 79 travels in an endless manner along a plurality of primary transfer rolls 77 and travelling rollers 80*a*, 80*b*.

A plurality of sheets of paper 82 are stocked in the paper feeder 104. Paper 82 drawn out of the paper feeder 104 is fed to between the travelling roller 80*a* and the secondary transfer roll 81 by the paper conveying mechanism unit 105, as arrows a, b indicate. A toner transferring charger (not shown) is built inside the secondary transfer roll 81. Toner is transferred from the intermediate transfer belt 79 to the paper 82 passing through between the travelling roller 80*a* and the secondary transfer roll 81 along with the intermediate transfer belt 79.

Paper 82 where the toner has been transferred passes through the fixing device unit 107 by the paper conveying mechanism unit 105 as arrows c, d indicate, and is heated and pressurized by the fixing device unit 107 to solidify the toner.

In the case of double-face printing, paper 82 where an image is fixed is turned over by travelling backward by a double-face unit 106 as arrows e, f indicate, and is again fed to between the travelling roller 80*a* and the secondary transfer roll 81 by the paper conveying mechanism unit 105 as arrow b indicates. Then, it passes through between the travelling roller 80*a* and the secondary transfer roll 81, and toner is transferred to the rear surface of paper 82. Paper 82 where the toner has been transferred again passes through the fixing device unit 107 as arrows c, g indicate, to fix the image on its rear surface, and paper 82 is discharged from the copying machine 61.

It is to be noted that, although the surface potential sensor is provided only in the place of the photosensitive drum 65 in the above example, a potential of the intermediate transfer belt 79 after passage through the primary transfer roll 77 may be measured by the surface potential sensor and the toner transferring charger 78 inside the primary transfer roll 77 may be adjusted in accordance with a result of the measurement. Similarly, a potential of paper 82 after passage through the secondary transfer roll 81 may be measured by the surface potential sensor, and the toner transferring charger inside the secondary transfer roll 81 may be adjusted in accordance with a result of the measurement.

As described above, the surface potential sensor according to the present invention has a configuration including: a thin-film electret electrode with flexibility; and an electrostatic force detector configured to detect a change in electrostatic force that operates on the electret electrode.

One embodiment of the surface potential sensor according to the present invention has a configuration where an electrostatic shield member with a window open is provided in front of the electret electrode. According to such an embodiment, a surface potential of a narrow region within a target object, which corresponds to the window, can be calculated and hence it is possible to accurately measure a potential of a local region of the target object.

The electret electrode in another embodiment of the surface potential sensor according to the present invention is one where an electret film is formed on the surface of a metal film. According to such an embodiment, corona discharging is generated in the metal film from a wire electrode and electrons are implanted into the electret film to allow charging.

Still another embodiment of the surface potential sensor according to the present invention has a configuration where an outer peripheral portion of the electret electrode is supported by a support, and an inner region thereof is floating in a space. According to such an embodiment, the electret electrode is apt to deform, thus leading to improvement in sensitivity of the surface potential sensor.

Still another embodiment of the surface potential sensor according to the present invention has a configuration where the electrostatic force detector has: a deformable member which deforms in response to deformation of the electret electrode; and a distortion quantity detecting device configured to detect a distortion quantity of the deformable member. In such an embodiment, a deformation amount of the electret electrode can be seen by detecting a distortion quantity of a deformable member that deforms due to deformation of the electret electrode, and hence it is possible to detect electrostatic force that operates on the electret electrode and whether it is positive or negative. As thus described, the electrostatic force that operates on the electret electrode may not be directly measured but may be indirectly measured.

Still another embodiment of the surface potential sensor according to the present invention has a configuration where the rear surface of the electret electrode is supported by an elastic material. According to such an embodiment, when electrostatic force is applied to the electret electrode, the electret electrode is warped while the elastic material is deformed, to detect a potential of the target object. Further, since the rear surface of the electret electrode is supported by the elastic material, the electret electrode is resistant to damage, and the durability of the surface potential sensor is improved.

Still another embodiment of the surface potential sensor according to the present invention has a configuration where a semiconductor layer is provided on the rear surface of the electret electrode, and the electrostatic force detector is configured of a piezoresistor formed on the semiconductor layer. Especially one in which a bridge circuit is configured of four piezoresistors may be taken as an electrostatic force detecting unit. According to such an embodiment, the electrostatic force detector can be produced by a MEMS semiconductor process.

Still another embodiment of the surface potential sensor according to the present invention has a configuration where the electrostatic force detector is configured of: a movable electrode configured to deform along with the electret electrode; and a fixed electrode opposed to the movable electrode. According to such an embodiment, a change in electrostatic force that operates on the electret electrode can be detected as a change in capacitance between the movable electrode and the fixed electrode.

A copying machine according to the present invention has a configuration provided with the surface potential sensor according to the present invention. For example, it is one where the surface potential sensor is arranged as opposed to the outer peripheral surface of a photosensitive drum. Since such a copying machine uses the surface potential sensor of the present invention, it is possible to accurately measure a potential of each region. Further, since the surface potential sensor can be miniaturized, restrictions in incorporating it into the copying machine are reduced.

Moreover, since the surface potential sensor of the present invention can be miniaturized, it can be caused to travel along a width direction of the photosensitive drum, and can thus measure a potential on the entire surface of the photosensitive drum. Hence it is possible to more finely inspect deterioration in photosensitive drum, and improve the printing quality.

It is to be noted that the means for solving the problem in the present invention is a configuration formed by appropriately combining the above described structural elements, and the present invention is able to have a large number of variations by such combination of the structural elements.

INDUSTRIAL APPLICABILITY

The surface potential sensor of the present invention is usable for any product so long as it is used for measuring a potential of an object surface. Among them, it is optimally used for an electrostatic copying machine, especially a large-sized electrostatic copying machine, a laser beam printer and the like for business purpose. Other than those, it can be used for charging measurement for a liquid crystal display, monitoring of static electricity in an IC production process, surface potential measurement for a silicon wafer, surface potential measurement for a variety of films and paper, a variety of material testing, and general static electricity measurement.

DESCRIPTION OF SYMBOLS 21, 51, 57 surface potential sensor
22 semiconductor substrate
25 diaphragm
26 metal film
27 electret film
28 electret electrode
29a, 29b, 29c, 29d piezoresistor
32 distortion quantity detecting unit
33 electrostatic shield member
34 window
36 induction region
41 target object
54 sensing lever
55 strain gauge
56 elastic material
58 fixed electrode
59 movable electrode
61 copying machine
65 photosensitive drum
68 charger
69 exposure unit
70 surface potential sensor
71 high voltage generator
74 development unit
79 intermediate transfer belt
110 control circuit
111 operating panel

The invention claimed is:

1. A surface potential sensor, comprising:
a thin-film electret electrode with flexibility, wherein the rear surface of the thin-film electret electrode is supported by an elastic material; and
an electrostatic force detector configured to detect a change in electrostatic force that operates on the thin-film electret electrode, wherein
the electrostatic force detector comprises:
a deformable member which deforms in response to deformation of the thin-film electret electrode; and
a distortion quantity detecting device configured to detect a distortion quantity of the deformable member,
wherein the deformable member and the distortion quantity detecting device are embedded in the elastic material without being exposed.

2. The surface potential sensor according to claim 1, wherein an electret film is formed on the surface of a metal film in the thin-film electret electrode.

3. The surface potential sensor according to claim 1, wherein
an outer peripheral portion of the thin-film electret electrode is supported by a support, and
an inner region thereof is floating in a space.

4. A copying machine, comprising:
the surface potential sensor according to claim 1.

5. The copying machine according to claim 4, wherein the surface potential sensor is arranged as opposed to the outer peripheral surface of a photosensitive drum.

6. The copying machine according to claim 5, wherein the surface potential sensor is configured to be capable of travelling along a width direction of the photosensitive drum.

* * * * *